SURFACE-BARRIER PHOTOCELLS

Filed March 24, 1961

*INVENTORS,*
EDWIN R. AHLSTROM
ERNST J. SCHIEL
*BY* Jack H. Linscott
ATTORNEY.

United States Patent Office 3,049,622

Patented Aug. 14, 1962

3,049,622
SURFACE-BARRIER PHOTOCELLS

Edwin R. Ahlstrom, Neptune, and Ernst J. Schiel, Oakhurst, N.J., assignors to the United States of America as represented by the Secretary of the Army Filed Mar. 24, 1961, Ser. No. 98,277
1 Claim. (Cl. 250—211)
(Granted under Title 35, U.S. Code (1952), sec. 266)

The invention described herein may be manufactured and used by or for the Government for governmental purposes without the payment of any royalty thereon.

This invention relates to surface-barrier photocells and more particularly to improved photocells of this type having high sensitivity paired with very short response time.

Hitherto, surface-barrier junction photocells exhibiting photoelectric effects have consisted of a transparent metal film on a semiconductor crystal. However, these photocells suffered from a high surface resistance due to the small area contact to its active surface. This resistance of the metal film acted as a series resistance, and cut the power yield as well as increasing the RC time constants of the photocell. Hence, this film resistance was a limiting factor in the photocell both as far as sensitivity and response time were concerned. All of these prior art devices, while useful in certain limited applications, have failed to provide an effective and efficient photocell for rapid scanning applications and for the observation of very fast phenomena where short response times of one microsecond or less is required. While such photocells were also useful in connection with the conversion of solar energy, their efficiency was still below the desired value because of their high surface resistivity.

An object of this invention is to provide a surface-barrier photocell having a large area contact on its active surface whose response time is faster than previously attained.

Another object of this invention is to provide a surface-barrier photocell with improved conversion efficiency of solar energy.

In general, the present invention depends for its novel result upon the reduction of the surface resistance of the surface-barrier metal film on a semiconductor crystal to a minimum. In one form, the metal film is coated with a metal oxide material; while in a second form by the contact of a metal oxide, which has been deposited on a glass plate, against the metal film. In each instance, innumerable electrical contacts are made over the whole area of the metal film so that the effective surface resistance is greatly reduced.

Figure 1:
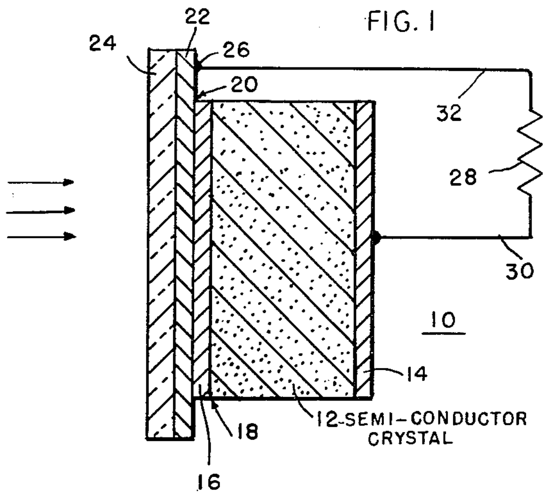
Figure 2:
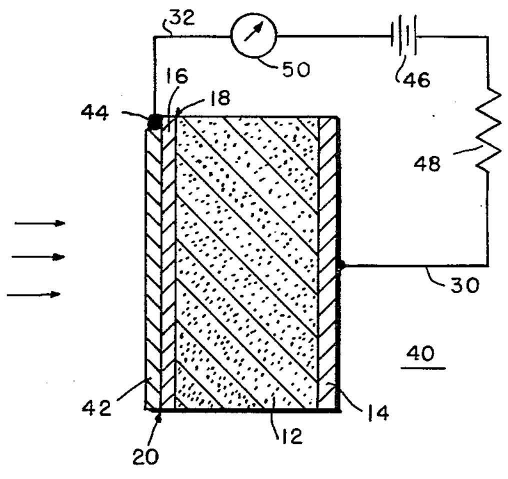

For a more detailed description of the invention, together with other and further objects thereof, reference is had to the following description taken in connection with the accompanying drawing, in which similar numerals designate similar elements and wherein:

FIG. 1 shows in section a surface-barrier junction photovoltaic device according to the invention with an appropriate load circuit; and FIG. 2 is a sectional view of another embodiment of the invention.

The present invention can be utilized in photoelectric apparatus using any one of the different types of photocells, whether photovoltaic, photoconductive or photodiode. The embodiments shown in FIG. 1 and FIG. 2 illustrating photovoltaic and photoconductive types respectively, are only exemplary and not limiting.

Referring to the drawing, there is shown in FIG. 1 a photocell 10 which may serve to convert solar radiation into electrical energy. Photocell 10 is utilized in a photovoltaic device and includes plate or body 12 made of semiconductor material preferably of n-type silicon, having an ohmic contact 14 on one surface and a transparent rectifying surface-barrier film 16 on the other surface. Other semiconductor materials which may be used are germanium, gallium arsendide and other III–V compounds. The film 16 may be vaporized on body 12 and is preferably made of gold, but may be silver, rhodium, aluminum or other suitable metals. Between the body 12 and the film 16 is the rectifying junction barrier 18. The film 16 has a surface 20 adapted to receive radiation in the visible region of the spectrum, and transmits sufficient radiant energy to effect the junction 18.

To reduce the effective resistance of the large area of surface 20 to a minimum, a layer of optically transparent and electrically conducting material is provided upon the active surface 20 of film 16. Such a layer may comprise a thin transparent coating of metal oxide such as tin oxide or of titanium oxide. As shown in the drawing, a layer 22 of metal oxide is applied on one face of a glass plate 24, whose overall dimensions are larger than that of film 16. The oxide layer 22 on plate 24 is maintained by any convenient means against film 16, so that layer 22 contacts the whole area of surface 20. In this manner innumerable electrical contacts are established over the whole area of surface 20, and an increase in the photovoltaic effect occurs when the n-type silicon body is illuminated by light passing through the glass plate 24, oxide layer 22 and metal film 16 as indicated by the arrows in FIG. 1.

Electrical contact is made to the metal oxide in any convenient way, as, for example, by soldering a copper wire 32 to the metal oxide 22 with indium solder 26. The power generated in the photocell 10 is consumed by an electrical load resistance 28 which has its terminals connected by conductors 32 and 30 to the coatings 22 and 14, respectively.

If a device of the type shown in FIG. 1 is used as a photodiode with modulated light signals, a battery is inserted in series with the resistance 28 in such manner as will bias the barrier junction 18 in the reverse direction.

The photocell 40, shown in FIG. 2, which is used herein as a photoconductive device includes similar basic parts as the photocell 10 shown in FIG. 1, such as the semiconductor body 12, ohmic contact 14, and the rectifying barrier film 16. However, in FIG. 2 a light transmitting layer of electroconductive metal oxide 42 is formed by vaporization directly upon the active surface 20 of film 16. In order to make good electrical connection to the layer 42, a small thin metallic contact 44 is provided on the periphery of film 16 before vapor deposition of layer 42 is made on surface 20. An electrical circuit including a source of current, such as a battery 46, a load device, such as resistor 48, and a current indicating device, such as milliammeter 50, may be connected in series between the ohmic contact 14 and the metallic contact 44 which serve as terminals for the photoconductive device. An increase in specific conductivity occurs when the semiconductor body 12 is illuminated by light passing through layer 42 and film 16, as indicated by the arrows.

The superior speed of response and the high efficiency of these photocells makes possible more extensive use of photoelectric instrumentation in such areas as space exploration and as process-like regulatory devices. Furthermore, the metallic film on the semiconductor body can now be chosen in the optimum thickness in respect to transparency and surface-barrier formation, because the problem of its surface resistance is no longer of concern in this improved photocell structure.

While there has been described what is at present considered to be the preferred embodiment of the invention, it will be obvious to those skilled in the art that various changes and modifications may be made therein without departing from the invention, and it is therefore aimed in the appended claim to cover all such changes and modifications as fall within the true spirit and scope of the invention.

What is claimed is:

A surface-barrier junction photocell comprising an n-type silicon plate, a light transmitting layer of gold vaporized on one surface of said plate to form a rectifying junction therebetween, an ohmic contact on the other surface of said silicon plate, a transparent glass slab having overall dimensions substantially larger than the surface of said layer of gold, a layer of transparent electroconductive tin oxide vaporized on one surface of said glass slab, said glass slab maintained against said layer of gold so that the layer of tin oxide on said glass slab contacts the whole surface area of said layer of gold.

References Cited in the file of this patent

UNITED STATES PATENTS

| | | |
|---|---|---|
| 2,089,830 | Grondahl et al. | Aug. 10, 1937 |
| 2,160,383 | Kannenberg | May 30, 1939 |
| 2,622,117 | Benzer | Dec. 16, 1952 |
| 2,879,405 | Pankove | Mar. 24, 1959 |
| 2,985,805 | Nelson | May 23, 1961 |